United States Patent
Ohkuni

(10) Patent No.: US 6,274,502 B1
(45) Date of Patent: Aug. 14, 2001

(54) METHOD FOR PLASMA ETCHING

(75) Inventor: Mitsuhiro Ohkuni, Nara (JP)

(73) Assignee: Matsushita Electronics Corporation, Osaka (JP)

(*) Notice: Subject to any disclaimer, the term of this patent is extended or adjusted under 35 U.S.C. 154(b) by 0 days.

(21) Appl. No.: 09/201,826

(22) Filed: Dec. 1, 1998

(30) Foreign Application Priority Data

Feb. 26, 1998 (JP) .................................................. 10-044817
Apr. 3, 1998 (JP) .................................................. 10-091132

(51) Int. Cl.[7] ................................................ H01L 21/302
(52) U.S. Cl. ............................ 438/725; 438/729; 216/68; 216/71
(58) Field of Search .................................... 438/710, 714, 438/725, 729; 216/67, 68, 71; 156/345; 118/723 I, 723 IR, 723 AN

(56) References Cited

U.S. PATENT DOCUMENTS

| | | | |
|---|---|---|---|
| 4,948,458 | 8/1990 | Ogle . | |
| 5,531,834 | * 7/1996 | Ishizuka et al. | 118/723 I |
| 5,571,366 | * 11/1996 | Ishii et al. | 156/345 |
| 5,597,438 | * 1/1997 | Grewal et al. | 156/345 |
| 5,614,055 | 3/1997 | Fairbairn et al. . | |
| 5,888,413 | * 3/1999 | Okumura et al. | 216/68 |
| 6,027,606 | * 2/2000 | Mohn et al. | 156/345 |
| 6,089,182 | * 7/2000 | Hama | 118/723 I |

FOREIGN PATENT DOCUMENTS

| | | |
|---|---|---|
| 06267903 | 9/1994 | (JP) . |
| 08148476 | 6/1996 | (JP) . |
| 9-180897 | 7/1997 | (JP) . |
| 10-27785 | 1/1998 | (JP) . |
| 10-648882 | 3/1998 | (JP) . |

OTHER PUBLICATIONS

R.J. Hoekstra, et al. "Predictions of ion energy distributions and radical fluxes in radio frequency biased inductively coupled plasma etching reactors", Journal of Applied Physics, Vo., 79, No. 5, pp. 2275–2286, Mar. 1, 1996.

S. Morio, "Accomplishing SAC Etching with Selective Ratio of 50 in IPC, Key for High Selective Ratio is CH9F) Radical", Semiconductor World, vol. 15, pp. 26–29, Mar. 1996.

* cited by examiner

Primary Examiner—Gregory Mills
Assistant Examiner—Luz L. Alejandro
(74) Attorney, Agent, or Firm—McDermott, Will & Emery

(57) ABSTRACT

An apparatus for plasma etching comprises a chamber, a gas inlet port provided in the chamber to introduce etching gas into the chamber, a gas outlet port provided in a side portion of the chamber to exhaust the gas from said chamber, a sample stage provided within the chamber, and a spiral coil disposed externally of the chamber and in opposing relation with the sample stage to generate a plasma composed of the etching gas with a high-frequency induction field. The higher-voltage region of the spiral coil and the exhaust-side region of the sample stage are positioned on substantially the same side relative to the center axis of the chamber.

7 Claims, 17 Drawing Sheets

METHOD FOR PLASMA ETCHING

BACKGROUND OF THE INVENTION

The present invention relates to an apparatus and method for plasma etching. More particularly, it relates to an apparatus and method for plasma etching wherein a target film is etched by a plasma generated with a high-frequency induction field produced by a spiral coil disposed in opposing relationship with a sample stage provided in a chamber.

With the increasing miniaturization of a semiconductor integrated circuit element in recent years, exposing light with a shorter wavelength has been used in a lithographic step. At present, the use of a KrF excimer laser (with a wavelength of 248 nm) or an ArF excimer laser (with a wavelength of 193 nm) is becoming prevalent.

As the wavelength of exposing light becomes shorter, the reflectivity of light reflected from a substrate after exposing a resist film becomes higher so that the reflected light from the substrate is more likely to cause variations in the size of a resist pattern. To prevent the reflected light from being incident on the resist film, there has recently been used a process wherein an organic bottom anti-reflective coating (hereinafter referred to as ARC) is formed under the resist film. The ARC process is primarily used in the manufacturing of a semiconductor element in a high-performance device with design rules whereby a gate width is 0.25 $\mu$m or less.

In the ARC process, it is necessary to etch the ARC after a resist pattern is formed by a conventional lithographic technique. Of a variety of plasma etching apparatus used to etch the ARC, an apparatus for inductively coupled plasma (ICP) etching with a spiral coil is used frequently.

As examples of the inductively coupled apparatus for plasma etching, an apparatus for inductively coupled plasma etching having a planar coil (see U.S. Pat. No. 4,948,458), an apparatus for inductively coupled plasma etching with a dome-shaped coil (see U.S. Pat. No. 5,614,055), and the like are known.

Referring to FIG. 10, a conventional apparatus for inductively coupled plasma etching having a planar single spiral coil will be described.

As shown in FIG. 10, a sample stage 2 as a lower electrode to which high-frequency power is applied is disposed in the lower portion of a grounded chamber I having an inner wall covered with an insulator such as ceramic, alumina, or quartz. A semiconductor substrate 3 as a sample to be etched is placed on the sample stage 2. The chamber 1 is provided with gas inlet ports (not shown) for introducing etching gas into the chamber 1 via a mass flow controller and with a gas outlet port 5 connected to a turbo pump for setting pressure in the chamber 1 to the order of 0.1 Pa to 10 Pa.

A single spiral coil 4 of inductively-coupled type is disposed atop the chamber 1 externally thereof in opposing relationship with the sample stage 2. The single spiral coil 4 has one end connected to a high-frequency power source via a matching circuit (not shown) and the other end connected to a wall of the chamber 1 and thereby grounded. The arrangement allows the single spiral coil 4 to generate a high-frequency induction field so that etching gas introduced into the chamber 1 is changed into a plasma. The etching gas changed into the plasma is guided by high-frequency power applied to the sample stage 2 toward the target film on the semiconductor substrate 3 held by the sample stage 2 so as to etch the target film.

When the present inventors performed an etching process with respect to an ARC as the target film by using a plurality of inductively coupled apparatus for plasma etching each having the planar single spiral coil 4 mentioned above, the problem occurred that the inplane uniformity of the etching rate varied with the different apparatus for plasma etching, though they were of the same model.

The inplane uniformity of the etching rate is defined as the degree of variations in etching rate across the surface of the target film and expressed as $3\sigma/\mu \times 100$ (%), where $\sigma$ is the standard deviation of a data value and $\mu$ is the mean value of the data value. When variations in data value exhibit a normal distribution, $3\sigma$ represents a deviation including 99.74% of the data value. The following equation (1) shows $3\sigma$ and $\mu$ specifically.

$$3\sigma = 3\sqrt{\frac{\sum_{i=1}^{n}(Xi-\mu)^2}{n}} \qquad \text{Equation 1}$$

$$\text{where } \mu: \text{ mean value} = \frac{\sum_{i=1}^{n} Xi}{n}$$

Conditions for the plasma etching process when the inplane uniformity of the etching rate was measured by using the conventional apparatus for plasma etching are as shown in Table 1.

In Table 1, ICP denotes high-frequency power applied to the single spiral coil 4 and RF denotes high-frequency power applied to the sample stage 2.

TABLE 1

| | |
|---|---|
| N$_2$/O$_2$ | 30/30 (sccm) |
| ICP/RF | 350/50 (W) |
| PRESSURE | 8 (mTorr) |
| TEMPERATURE OF SAMPLE STAGE | 10 (° C.) |

The models of apparatus for inductively coupled plasma etching and the inplane uniformities of the respective etching rates are as shown in Table 2. As shown in FIG. 18(a), etching was performed with respect to the ARC 11 as a target film formed on the semiconductor substrate 10.

TABLE 2

| APPARATUS MODEL | UNIFORMITY |
|---|---|
| APPARATUS A | ±4.5% |
| APPARATUS B | ±2.1% |
| APPARATUS C | ±5.6% |
| APPARATUS D | ±5.1% |
| APPARATUS E | ±3.3% |
| APPARATUS F | ±6.8% |
| APPARATUS G | ±2.6% |

As will be understood from Table 2, the inplane uniformities of the etching rates for the ARC 11 were ±4.5% for the apparatus A, ±2.1% for the apparatus B, ±5.6% for the apparatus C, ±5.1% for the apparatus D, ±3.3% for the apparatus E, ±6.8% for the apparatus F, and ±2.6% for the apparatus G and not constant.

The etching rate which is inferior in inplane uniformity causes variations in the actual amount of etching across the surface of the target film. If the actual amount of etching varies across the surface of the target film, an adverse effect is produced such as variations in the characteristics of a FET in the case of forming the gate electrode of the FET by etching.

SUMMARY OF THE INVENTION

In view of the foregoing, it is therefore an object of the present invention to improve the inplane uniformity of an etching rate when etching is performed with respect to a target film by using an apparatus for plasma etching and to reduce variations in the inplane uniformity of the etching rate from apparatus to apparatus for plasma etching of the same model.

As a result of various examinations of the above apparatus A to G, the present inventors found that the positional relationship between the single spiral coil 4 and the gas outlet port 5 varied with the different models of apparatus.

Assuming that the positional relationship between the single spiral coil 4 and the gas outlet port 5 affects the uniformity of the etching rate, the present inventors examined the varying positional relationship between the single spiral coil 4 and the gas outlet port 5 and found that the varying positional relationship between the single spiral coil 4 and the gas outlet port 5 caused uneven distribution of reactive radicals over the plasma generation region in the chamber 1. A description will be given below to the finding.

First, as shown in FIG. 11, it is assumed that the single spiral coil 4 consists of three portions which are: a coil portion 4a contributing directly to the generation of a high-frequency induction field; a power-source-side withdrawn portion 4b positioned between the coil portion 4a and the high-frequency power source 6, and a ground-side withdrawn portion 4c positioned between the coil portion 4a and a ground source 7. It is also assumed that the coil portion 4a consists of two regions separated by a first line L1 linking a power-source connection point A between the coil portion 4a and the power-source-side withdrawn portion 4b to the center point B of the coil portion 4a. Of the two regions of the coil portion 4a separated by the first line L1, the region containing a portion connected directly to the power-source connection point A is defined as a higher-voltage region (region where high-frequency voltage is relatively high) and the region not containing the portion connected directly to the power-source connection point A is defined as a lower-voltage region (region where high-frequency voltage is relatively low).

On the other hand, it is assumed that the sample stage 2 consists of two regions separated by a second line L2 perpendicular to a line linking the center portion C of the sample stage 2 to the center portion D of the gas outlet port 5, as shown in FIG. 12. Of the two separate regions, the region closer to the gas outlet port 5 is defined as an exhaust-side region and the region further away from the gas outlet port 5 is defined as a counter-exhaust-side region.

As shown in FIG. 13, an angle formed between the line 2 and the line L1 which is rotating clockwise relative to the line L2 starting from the state in which the exhaust-side region coincides with the lower-voltage region in overlapping relation and the counter-exhaust-side region and the higher-voltage region are in overlapping relation is defined as a rotation angle θ.

The rotation angle θ for each of the foregoing apparatus A to G is as shown in Table 3.

TABLE 3

| APPARATUS MODEL | ROTATION ANGLE θ |
|---|---|
| APPARATUS A | 90° |
| APPARATUS B | 150° |
| APPARATUS C | 60° |
| APPARATUS D | 75° |

TABLE 3-continued

| APPARATUS MODEL | ROTATION ANGLE θ |
|---|---|
| APPARATUS E | 120° |
| APPARATUS F | 30° |
| APPARATUS G | 135° |

As will be understood from Table 3, the rotation angle θ formed between the second line L2 and the first line L1 which is rotating clockwise with respect to the second line L2 varies with the conventional apparatus for plasma etching. From a comparison between Tables 2 and 3, it will also be understood that there is the correlation between the rotation angle θ and the inplane uniformity of the etching rate and that the inplane uniformity of the etching rate improves as the rotation angle θ increases.

The reason for this may be that the quantity of reactive radicals is larger in the area of the plasma generation region in the chamber 1 corresponding to the counter-exhaust-side region of the sample stage 2 than in the area thereof corresponding to the exhaust-side region of the sample stage 2, as shown in FIG. 14(a), and that the quantity of reactive radicals is larger in the area of the plasma generation region in the chamber 1 corresponding to the higher-voltage region of the single spiral coil 4 than in the area thereof corresponding to the lower-voltage region of the single spiral coil 4, as shown in FIG. 14(b).

Accordingly, if the exhaust-side region of the sample stage 2 and the higher-voltage region of the single spiral coil 4 are positioned on the same side and if the counter-exhaust-side region of the sample stage 2 and the lower-voltage region of the single spiral coil 4 are positioned on the same side, reactive radicals are evenly distributed over the plasma generation region in the chamber 1, as shown in FIG. 15(a). Conversely, if the exhaust-side region of the sample stage 2 and the lower-voltage region of the single spiral coil 4 are positioned on the same side and if the counter-exhaust-side region of the sample stage 2 and the higher-voltage region of the single spiral coil 4 are positioned on the same side, reactive radicals are unevenly distributed over the plasma generation region in the chamber 1, with reactive radicals present in smaller quantity in the area of the plasma generation region in the chamber 1 corresponding to the exhaust-side region of the sample stage 2 and to the lower-voltage region of the single spiral coil 4 than in the area thereof corresponding to the counter-exhaust-side region of the sample stage 2 and to the higher-voltage region of the single spiral coil 4.

The present invention has been achieved based on the foregoing findings and intends to evenly distribute reactive radicals over the plasma generation region in the chamber 1 by positioning the higher-voltage region of the spiral coil and the exhaust-side region of the sample stage on the same side relative to the center axis of the chamber. While the conventional apparatus for plasma etching attributes importance only to applying a current of ions having a uniform density to the semiconductor substrate 3 placed on the sample stage 2, the present invention attributes importance to supplying uniform reactive radicals to the semiconductor substrate 3 placed on the sample stage 2.

Specifically, an apparatus for plasma etching according to the present invention comprises: a chamber; a gas inlet port provided in the chamber to introduce etching gas into the chamber; a gas outlet port provided in a side portion of the chamber to exhaust the gas from the chamber; a sample stage provided within the chamber; and a spiral coil disposed externally of the chamber and in opposing relationship with the sample stage to generate a plasma composed of the etching gas with a high-frequency induction field, a higher-voltage region of the spiral coil and an exhaust-side region of the sample stage being positioned on substantially the same side relative to a center axis of the chamber.

When the higher-voltage region of the spiral coil and the exhaust-side region of the sample stage are positioned on substantially the same side, there are cases where the rotation angle θ formed between the second line L2 and the first line L1 which is rotating clockwise relative to the second line L2 is in the range of +135° to +180°, i.e., the overlapping angle is in the range of 135° to 180°, as shown in FIG. 16(a), or where the rotation angle θ formed between the second line L2 and the first line L1 which is rotating clockwise relative to the second line L2 is in the range of −135° to −180°, i.e., the overlapping angle is in the range of 135° to 180°, as shown in FIG. 16(b).

In the apparatus for plasma etching according to the present embodiment, the higher-voltage region of the spiral coil and the exhaust-side region of the sample stage are positioned on substantially the same side relative to the center axis of the chamber so that the lower-voltage region of the spiral coil and the counter-exhaust-side region of the sample stage are inevitably positioned on substantially the same side relative to the center axis of the chamber. Since the quantity of reactive radicals is relatively small in the area of the plasma generation region in the chamber corresponding to the lower-voltage region of the spiral coil and relatively large in the area thereof corresponding to the counter-exhaust-side region of the sample stage, the quantity of the reactive ions is averaged in the area of the plasma generation region in the chamber corresponding to the lower-voltage region and to the counter-exhaust-side region of the sample stage. On the other hand, since the quantity of reactive radicals is relatively large in the area of the plasma generation region in the chamber corresponding to the higher-voltage region of the spiral coil and relatively small in the area thereof corresponding to the exhaust-side region of the sample stage, the quantity of the reactive ions is averaged in the area of the plasma generation region in the chamber corresponding to the higher-voltage region and to the exhaust-side region of the sample stage.

Thus, the quantity of reactive radicals is averaged in each of the area of the plasma generation region in the chamber corresponding to the higher-voltage region and to the exhaust-side region and the area thereof corresponding to the lower-voltage region and to the counter-exhaust-side region, resulting in reactive radicals evenly distributed over the plasma generation region in the chamber.

In the apparatus for plasma etching according to the present invention, the spiral coil is preferably a single spiral coil having a planar configuration or a domed configuration.

In the apparatus for plasma etching according to the present invention, the spiral coil is preferably the longest one of a plurality of spiral coils arranged in parallel with each other.

In the apparatus for plasma etching according to the present invention, high-frequency power applied to the spiral coil is preferably higher than high-frequency power applied to the sample stage.

A method for plasma etching according to the present invention comprises: a plasma generating step of changing etching gas introduced into a chamber into a plasma with a high-frequency induction field generated by a spiral coil disposed in opposing relation with a sample stage in the chamber; an etching step of guiding the plasma toward a target film on a substrate held by the sample stage to etch the target film; and a gas exhaust step of exhausting gas from the chamber through a gas outlet port provided in a side portion of the chamber, the etching step including the step of guiding the plasma toward the target film to etch the target film with a higher-voltage region of the spiral coil and an exhaust-side region of the sample stage being positioned on substantially the same side relative to a center axis of the chamber.

In accordance with the method for plasma etching according to the present invention, the quantity of reactive radicals is averaged in each of the area of the plasma generation region in the chamber corresponding to the higher-voltage region and to the exhaust-side region and the area thereof corresponding to the lower-voltage region and to the counter-exhaust-side region, resulting in reactive radicals evenly distributed over the plasma generation region in the chamber.

In the method for plasma etching according to the present invention, high-frequency power applied to the spiral coil is preferably higher than high-frequency power applied to the sample stage.

In the method for plasma etching according to the present invention, the target film is preferably an organic film.

In the method for plasma etching according to the present invention, the target film is preferably an organic bottom anti-reflective coating or a resist film.

Thus, in the apparatus for plasma etching or method for plasma etching according to the present invention, the quantity of reactive radicals is averaged in each of the area of the plasma generation region in the chamber corresponding to the higher-voltage region and to the exhaust-side region and the area thereof corresponding to the lower-voltage region and to the counter-exhaust-side region, so that reactive radicals are evenly distributed over the plasma generation region in the chamber. Consequently, the etching rate for the target film on the substrate held by the sample stage becomes uniform across the surface of the target film, while the inplane uniformity of the etching rate does not vary with different apparatus for plasma etching.

BRIEF DESCRIPTION OF THE DRAWINGS

FIGS. 1(a) and 1(b) show an apparatus for plasma etching according to a first embodiment of the present invention, of which FIG. 1(a) is a schematic plan view of a single spiral coil and FIG. 1(b) is a schematic cross-sectional view of the apparatus for plasma etching;

FIGS. 5(a) and 5(b) show an apparatus for plasma etching according to a second embodiment of the present invention, of which FIG. 5(a) is a plan view thereof and FIG. 5(b) is a cross-sectional view thereof;

FIGS. 9(a) and 9(b) show an apparatus for plasma etching according to a fifth embodiment of the present invention, of which FIG. 9(a) is a schematic plan view of a single spiral coil and FIG. 9(b) is a schematic cross-sectional view of the apparatus for plasma etching;

DETAILED DESCRIPTION OF THE INVENTION

EMBODIMENT 1

Figure 1A:
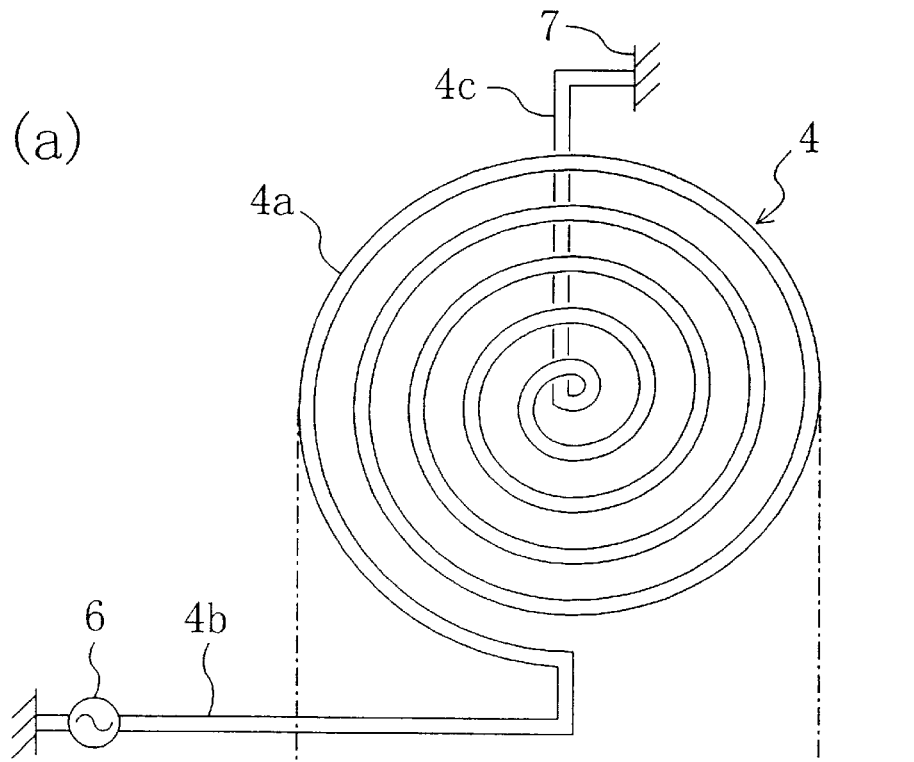
Figure 1B:
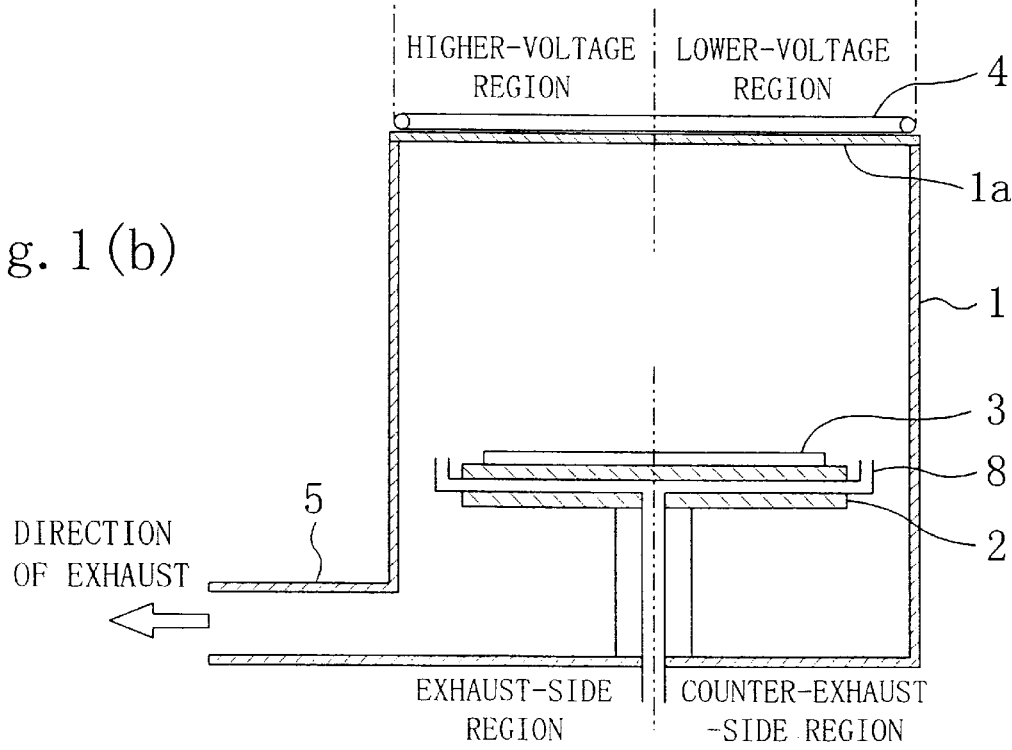
Figure 2:
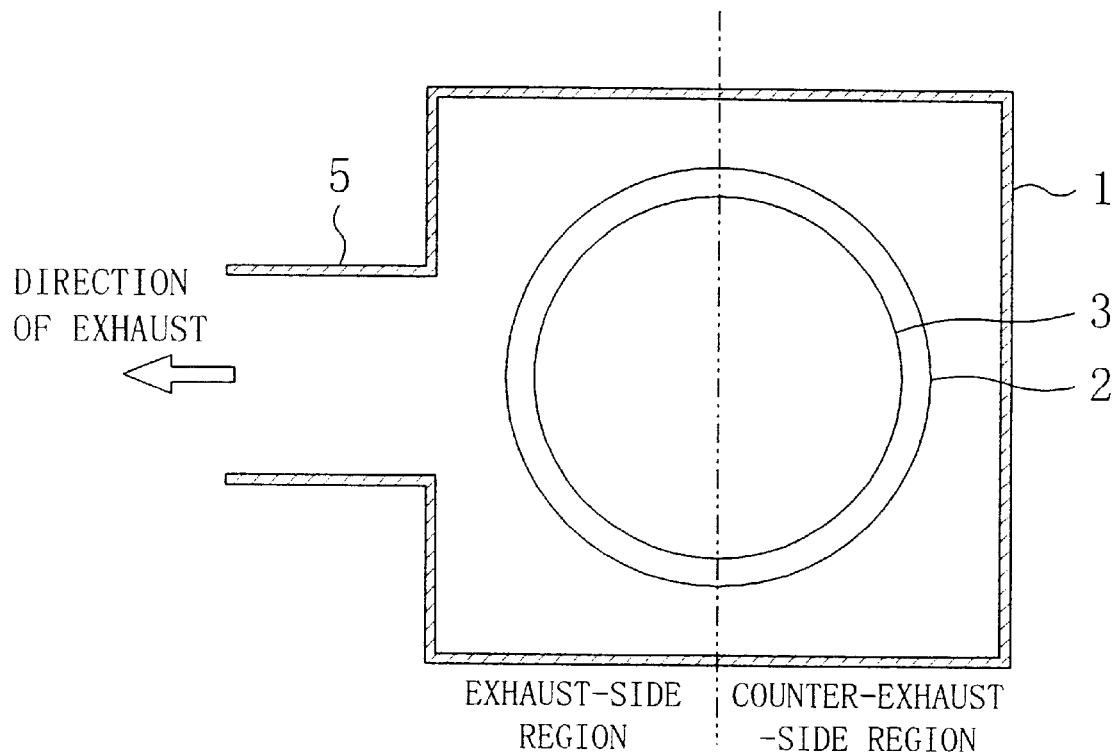
FIG. 2 is a schematic plan view of a chamber of the apparatus for plasma etching according to the first embodiment.

An apparatus and method for plasma etching according to a first embodiment of the present invention will be described with reference to FIGS. 1(a) and 1(b) and FIG. 2.

A cylindrical chamber 1 has an outer diameter of 400 mm and a height of 300 mm, for example. The chamber 1 has an inner wall covered with an insulator such as ceramic, alumina, or quartz. A sample stage 2 as a lower electrode to which high-frequency power is applied is disposed in the chamber 1. A semiconductor substrate 3 as a sample to be etched is placed on the sample stage 2. The chamber 1 is internally provided with a plurality of gas inlet ports 8 for introducing etching gas into the chamber 1 which are dispersively positioned to surround the sample stage 2. The side portion of the chamber 1 is provided with a gas outlet port 5 connected to a turbo pump for setting pressure in the chamber 1 to the order or 0.1 Pa to 10 Pa. An inductively coupled single coil 4 is disposed on a quartz plate 1a with a thickness of, e.g., 20 mm provided on the ceiling of the chamber 1 such that the single spiral coil 4 is in opposed relationship with the sample stage 2. The single spiral coil 4 consists of three portions which are: a coil portion 4a contributing directly to the generation of a high-power induction field; a power-source-side withdrawn portion 4b positioned between the coil portion 4a and a high-frequency power source 6; and a ground-side withdrawn portion 4c positioned between the coil portion 4a and a ground source 7. The power-source-side withdrawn portion 4b of the single spiral coil 4 is connected to the high-frequency power source 6 for supplying first high-frequency power via a matching circuit (not shown). The ground-side withdrawn portion 4c of the single spiral coil 4 is connected to a wall of the chamber 1 and thereby grounded. The arrangement allows the single spiral coil 4 to generate a high-frequency induction field so that etching gas introduced into the chamber 1 is changed into a plasma. The etching gas changed into the plasma is guided by second high-frequency power applied to a sample stage 2 toward a target film on the semiconductor substrate 3 held by the sample stage 2 and etches the target film.

Figure 11:
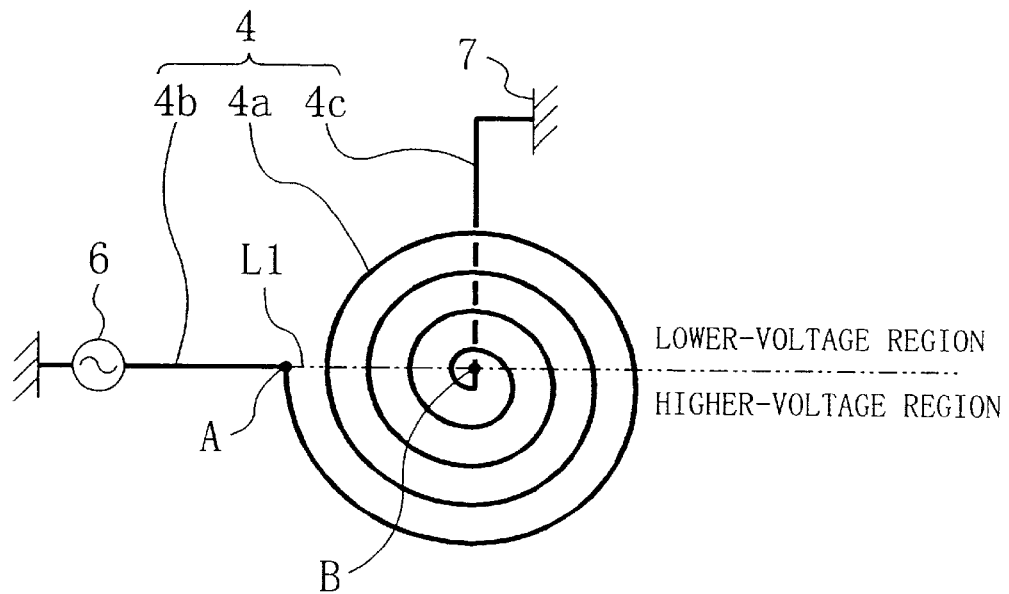
FIG. 11 is a plan view for illustrating lower-voltage and higher-voltage regions of a single spiral coil in an apparatus for plasma etching according to the present invention.
Figure 12:
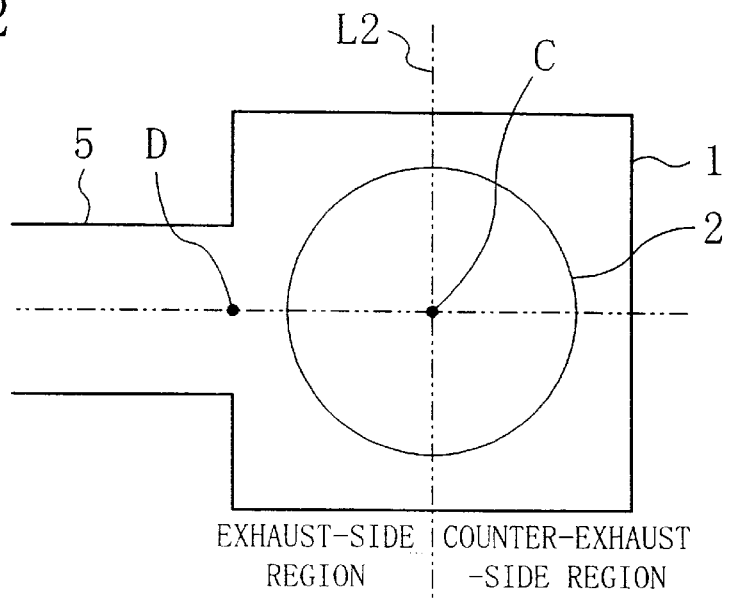
FIG. 12 is a plan view for illustrating exhaust-side and counter-exhaust-side regions of a sample stage in the apparatus for plasma etching according to the present invention.
Figure 13:
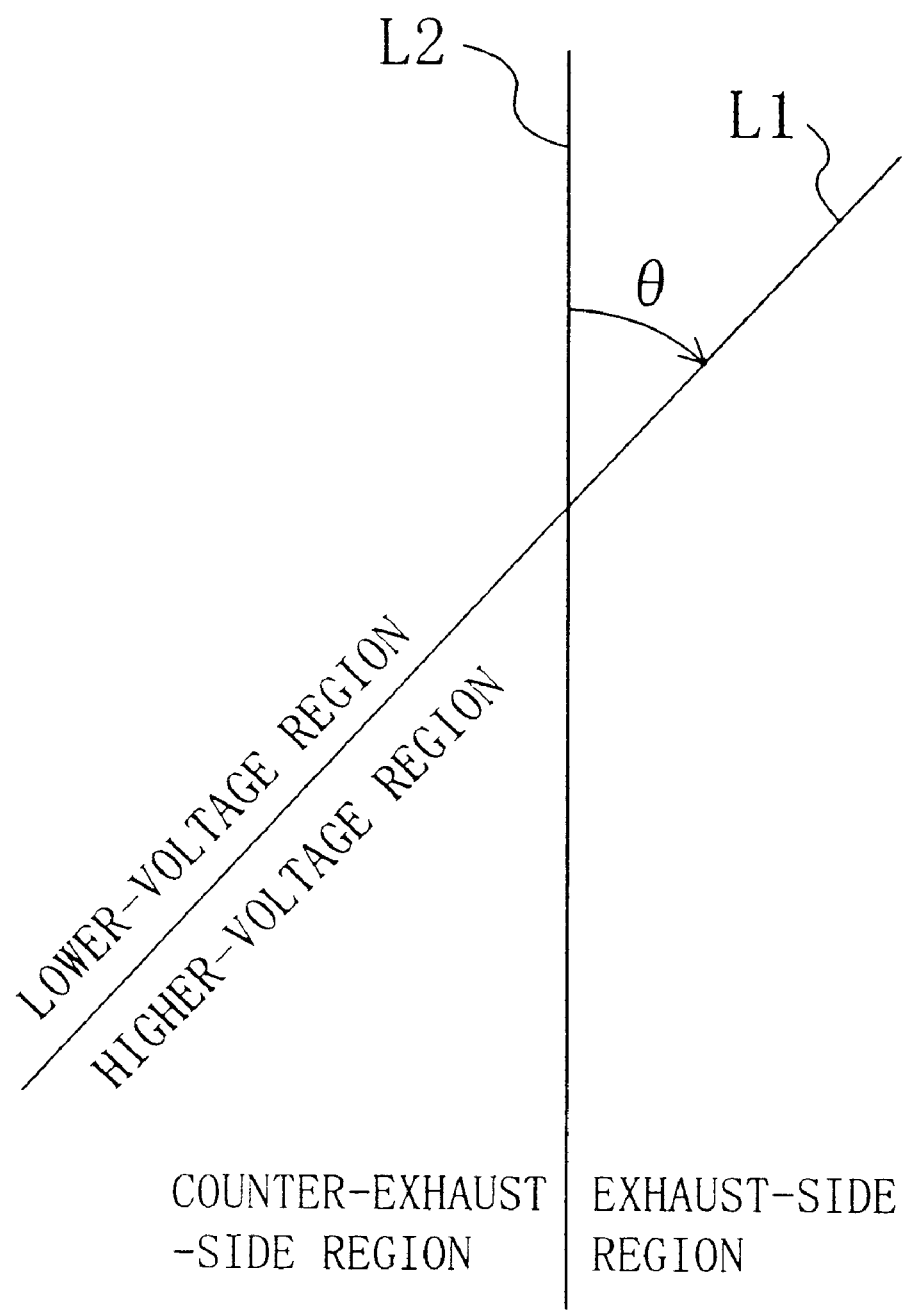
FIG. 13 illustrates a rotation angle formed between a first line separating the lower-voltage and higher-voltage regions of the single spiral coil and a second line separating the exhaust-side and counter-exhaust-side regions of the sample stage when the first line rotates relative to the second line in the apparatus for plasma etching according to the present invention.
Figure 14A:
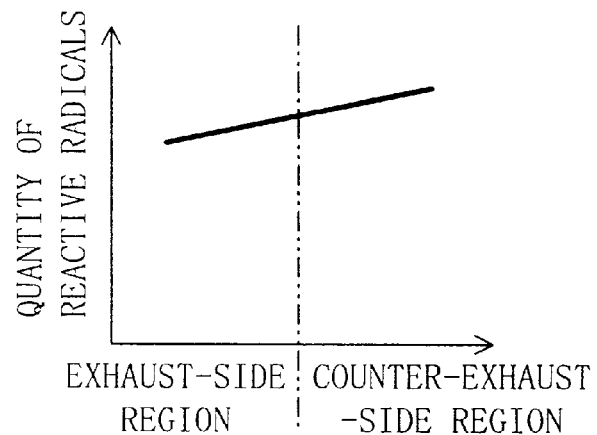
FIG. 14(a) illustrates the distribution of reactive radicals over the exhaust-side and counter-exhaust-side regions of the sample stage in the apparatus for plasma etching according to the present invention and FIG. 14(b) illustrates the distribution of reactive radicals over the lower-voltage and higher-voltage regions of the single spiral coil in the apparatus for plasma etching according to the present invention.
Figure 14B:
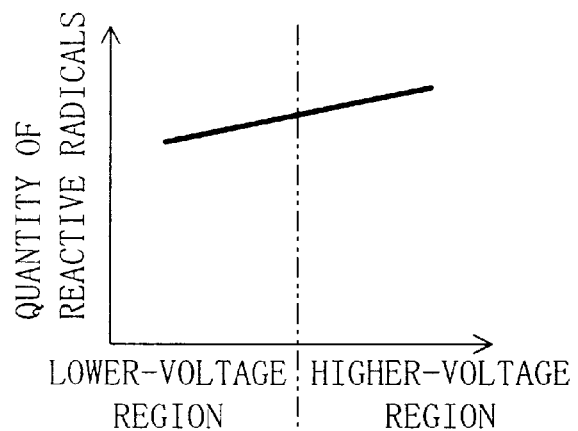
Figure 15A:
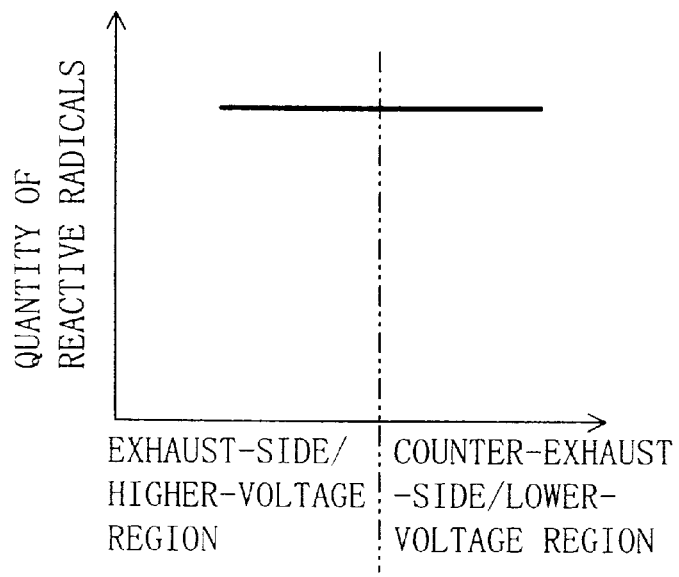
FIG. 15(a) illustrates the distribution of reactive radicals over the exhaust-side/higher-voltage region and the counter-exhaust-side/lower-voltage region in the apparatus for plasma etching according to the present invention and FIG. 15(b) illustrates the distribution of reactive radicals over the exhaust-side/lower-voltage region and the counter-exhaust-side/higher-voltage region in the apparatus for plasma etching according to the present invention.
Figure 15B:
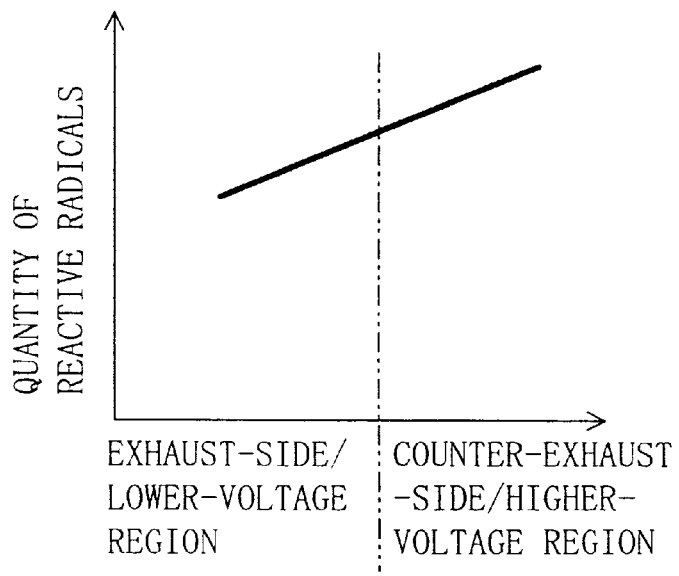

The first embodiment is characterized in that a higher-voltage region which is the region of the single spiral coil 4 relatively high in voltage and an exhaust-side region which is the region of the sample stage 2 closer to the gas outlet port 5 are positioned on the same side (left side of FIG. 1) relative to the center axis of the chamber 1, while a lower-voltage region which is the region of the single spiral coil 4 relatively low in voltage and a counter-exhaust-side region which is the region of the sample stage 2 further away from the gas outlet port 5 are positioned on the same side (right side of FIG. 1) relative to the center axis of the chamber 1. As a result, a rotation angle θ formed between a second line L2 and a first line L1 which is rotating clockwise relative to the second line L2 (see FIGS. 11 to 13) is 180°.

Consequently, the quantity of reactive radicals distributed over the plasma generation region in the chamber 1 is averaged in each of the area of the plasma generation region in the chamber 1 corresponding to the higher-voltage region of the single spiral coil 4 and to the exhaust-side region of the sample stage 2 and the area thereof corresponding to the lower-voltage region of the single spiral coil 4 and to the counter-exhaust-side region of the sample stage 2, resulting in a uniform etching rate for the target film on the semiconductor substrate 3 held by the sample stage 2.

Figure 10:
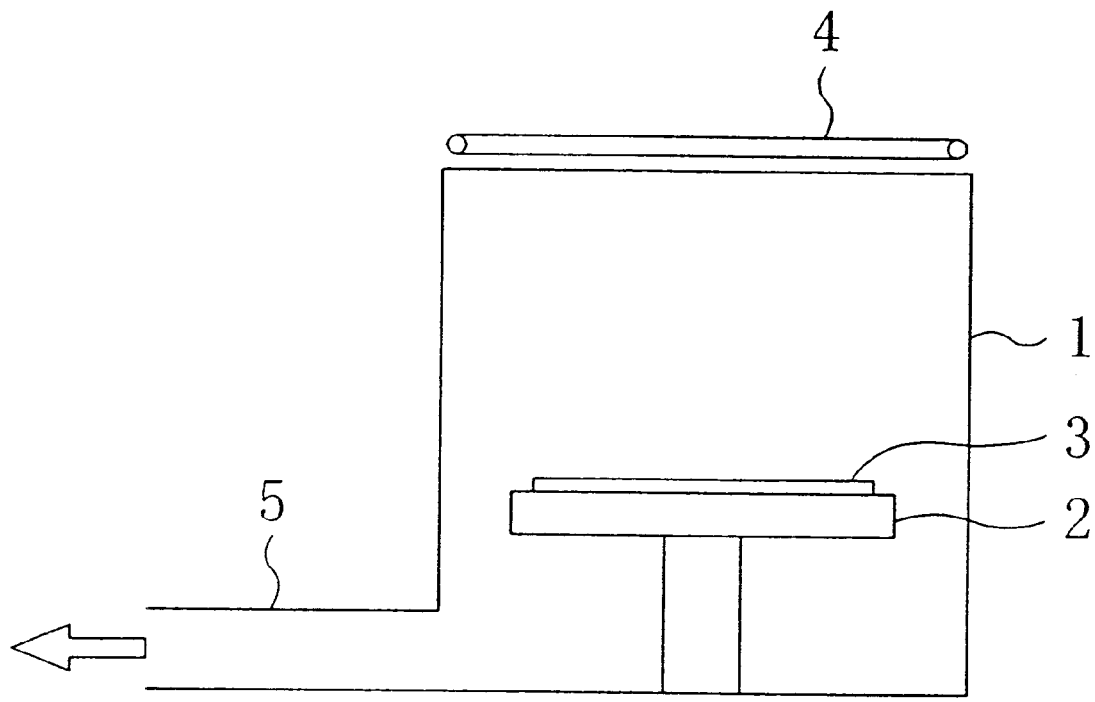
FIG. 10 is a schematic cross-sectional view of a conventional apparatus for plasma etching.

When plasma etching was performed with respect to the ARC 11 shown in FIG. 10 under the etching conditions shown in Table 1 according to the first embodiment, the uniformity of the etching rate was ±1.0% and there was no variation in etching rate with different apparatus for plasma etching.

Figure 16A:
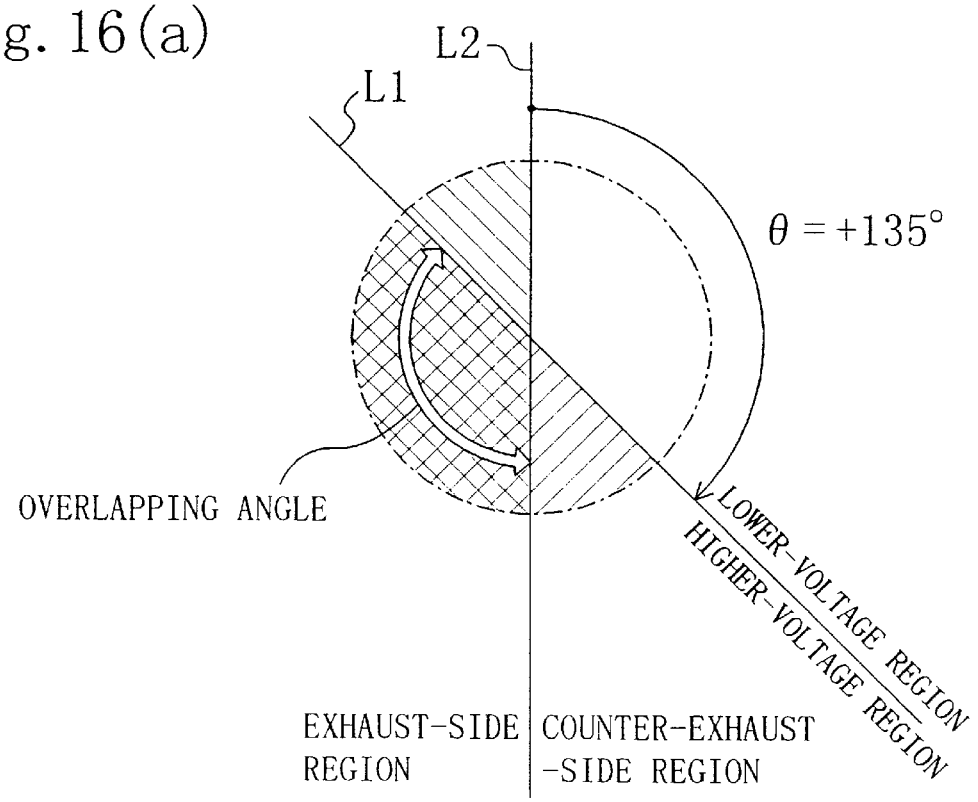
FIGS. 16(a) and 16(b) show conditions required to position the higher-voltage region of the spiral coil and the counter-exhaust-side region of the sample stage on substantially the same side relative to the center axis of the chamber in each of the embodiments of the present invention.
Figure 16B:
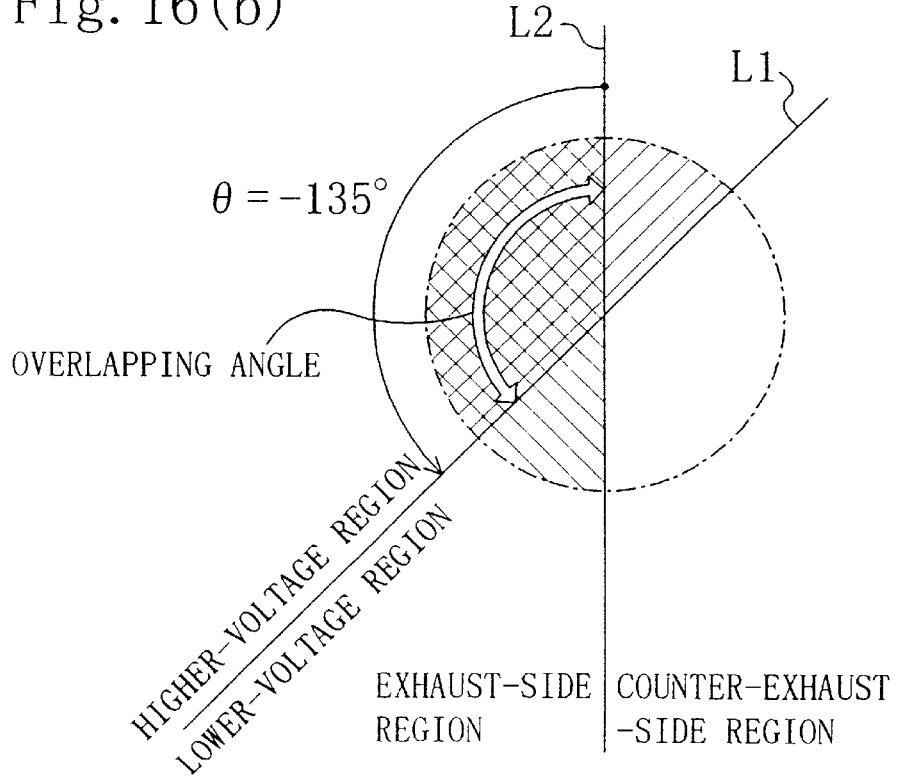
Figure 17:
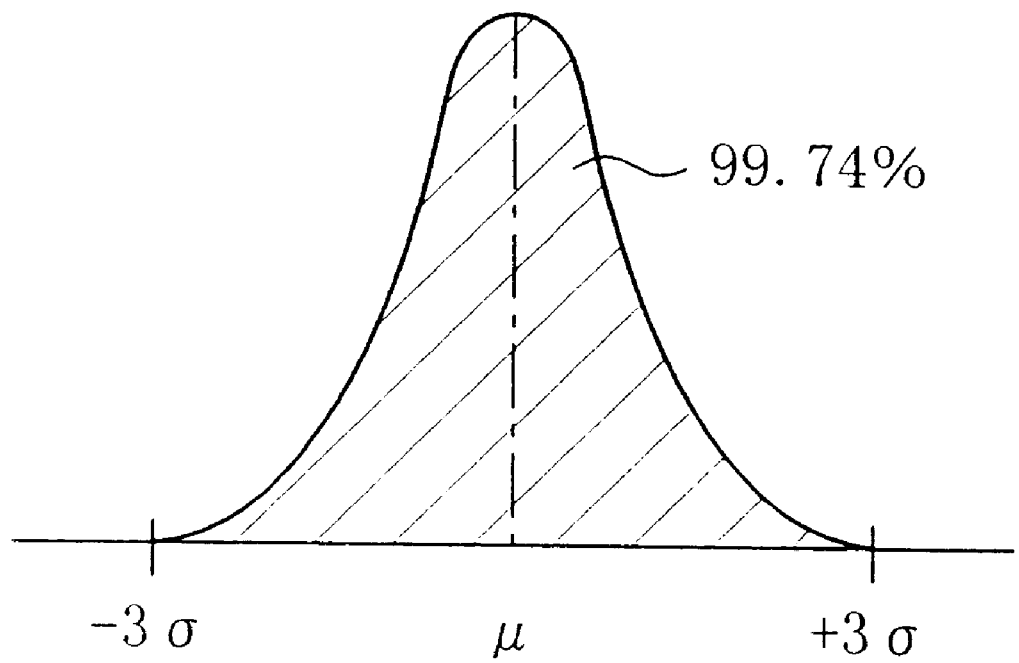
FIG. 17 illustrates the definition of the uniformity of an etching rate in the case of performing plasma etching by using the apparatus for plasma etching according to the present invention and the conventional apparatus for plasma etching.

The rotation angle θ formed between the line L2 and the first line L1 which is rotating clockwise relative to the second line L2 need not necessarily be 180°. It was experimentally proved that the effect of improving the uniformity of the etching rate was achieved as long as the rotation angle θ was in the range of +135° to +180° as shown in FIG. 16(a) or in the range of −135° to −180°, i.e., as long as the overlapping angle was in the range of 135° to 180°. It was also experimentally proved that the effect of improving the uniformity of the etching rate was outstanding as long as the rotation angle θ was in the range of +170° to +180° or in the range of −170° to −180°, i.e., as long as the overlapping angle was in the range of 170° to 180°.

Figure 3:
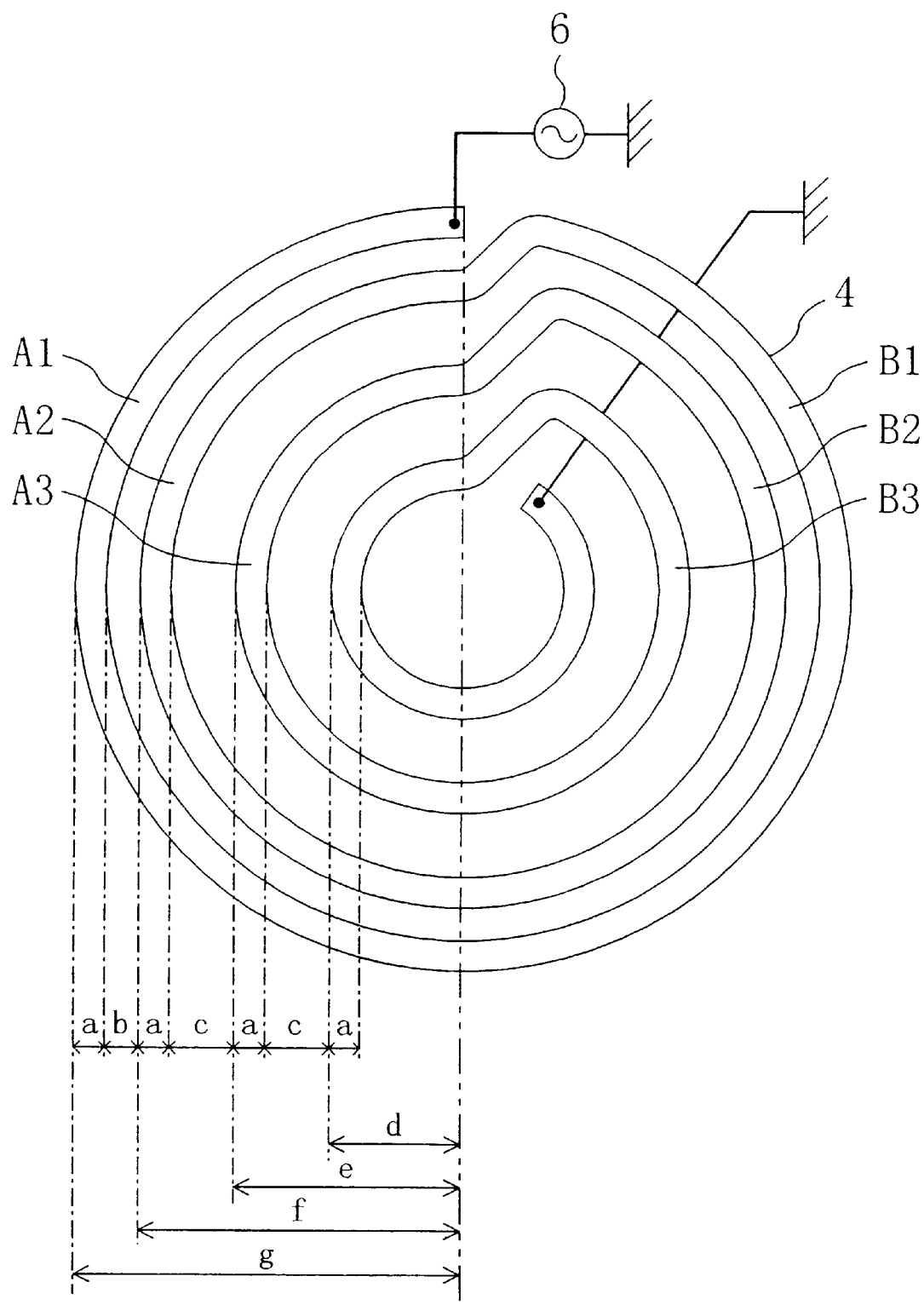
FIG. 3 is a plan view showing a first specific example of the single spiral coil of the apparatus for plasma etching according to the first embodiment.

FIG. 3 shows a first specific example of the single spiral coil 4 in the apparatus for plasma etching according to the first embodiment. The single spiral coil 4 is composed of a square pipe of copper having an inner diameter of ⅜ inches (about 0.95 cm), wherein a=1.2 cm, b=1.3 cm, c=2.5 cm, d=5.1 cm, e=8.8 cm, f=12.5 cm, and g=15.0 cm. The single spiral coil 4 may also be formed of a conductor other than copper or may also be composed of a round pipe instead of the square pipe.

As shown in FIG. 3, the coil portions 4a of the single spiral coil 4 has been divided into segments A1, A2, and A3 composing the higher-voltage region and into segments B1, B2, and B3 composing the lower-voltage region. Since a mean potential difference between the ground voltage and a voltage across each of the segments A1, A2, and A3 is higher than a mean potential difference between the ground voltage and a voltage across each of the segments B1, B2, and B3, a DC bias component and a high-frequency induction field placed by a capacitively-coupled plasma component generated from the higher-voltage region of the coil portion 4a on the quartz plate 1a is intenser than a DC bias component and a high-frequency induction field placed by a capacitively coupled plasma component generated from the lower-voltage region of the coil portion 4a on the quartz plate 1a.

Figure 4:
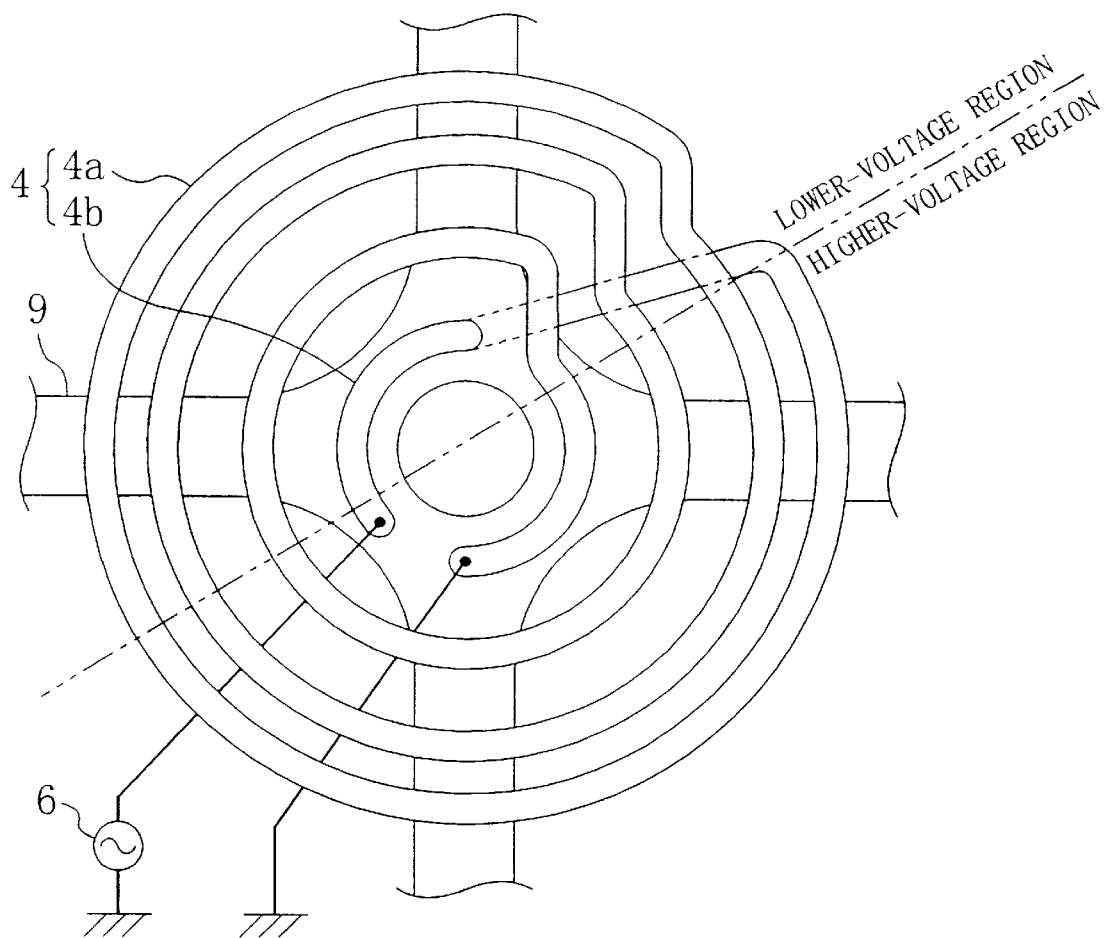
FIG. 4 is a plan view showing a second specific example of the single spiral coil of the apparatus for plasma etching according to the first embodiment.

FIG. 4 shows a second specific example of the single spiral coil 4 in the apparatus for plasma etching according to the first embodiment. The single spiral coil as the second specific example is slightly different in plan structure from the spiral coil 4 as the first specific example. That is, the single spiral coil 4 is held by an insulating coil holder 9 having a crisscross configuration. The coil portion 4a of the single spiral coil 4 is placed on the coil holder 9 via an insulator, while the power-source-side withdrawn portion 4b of the single spiral coil 4 is bent inwardly at an outer circumferential point to extend through the interior of the coil holder 9 from the lower side to the upper side. After circulating by about 120°, the power-source-side withdrawn portion 4b is connected to the high-frequency power source 6 at the center portion of the coil holder 9.

EMBODIMENT 2

Figure 5A:
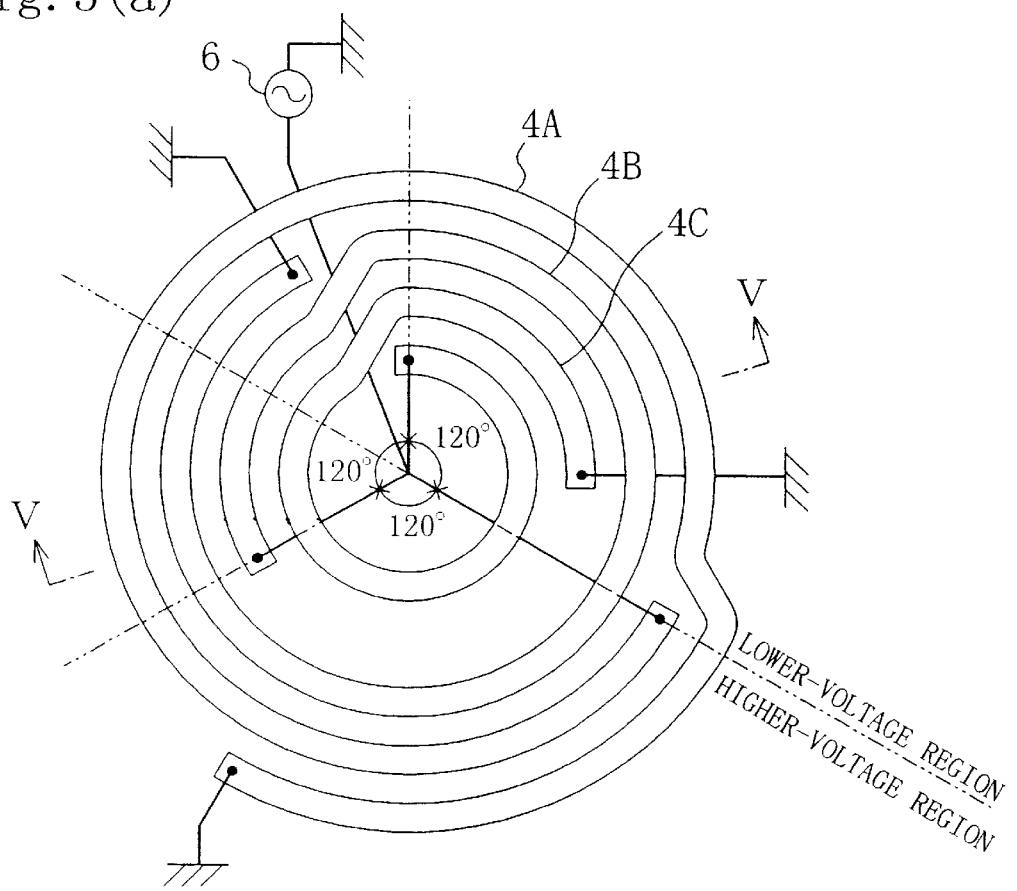
Figure 5B:
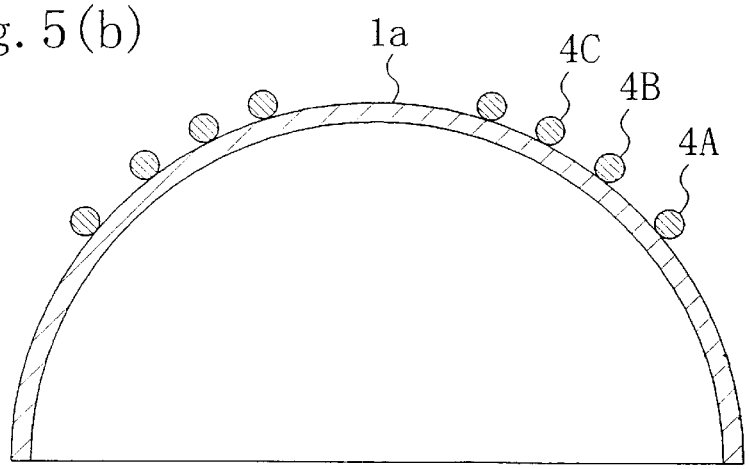

An apparatus and method for plasma etching according to a second embodiment of the present invention will be described with reference to FIGS. 5(a) and 5(b). Since the plan configuration of the chamber 1, the sample stage 2, the gas inlet port 8, and the gas outlet port 5 used in the second embodiment are the same as used in the first embodiment, the description thereof will be omitted.

The second embodiment is characterized in that a dome-shaped quartz 1a is provided on the ceiling of the chamber 1. A plurality of spiral coils consisting of, e.g., first, second, and third spiral coils 4A, 4B, and 4C are disposed on the dome-shaped quartz 1a to be in opposing relationship with the sample stage 2. The first to third spiral coils 4A to 4C are disposed in parallel in the radial direction, while they are mutually shifted in position by 120° in the circumferential direction. Each of the first to third spiral coils 4A to 4C has such a length as to allow it to make approximately 1.25 turns of winding.

In the case of using the structure in which the plurality of spiral coils are arranged in parallel as used in the second embodiment, reactive radicals are evenly distributed over the plasma generation region in the chamber when the higher-voltage region of the first spiral coil 4A disposed in the outermost position and having a maximum length and the exhaust-side region of the sample stage 2 are positioned on the same side relative to the center axis of the chamber and the lower-voltage region of the first spiral coil 4A and the counter-exhaust-side region of the sample stage 2 are positioned on the same side relative to the center axis of the chamber, resulting in a uniform etching rate for the target film on the semiconductor substrate 3 held by the sample stage 2.

Figure 6:
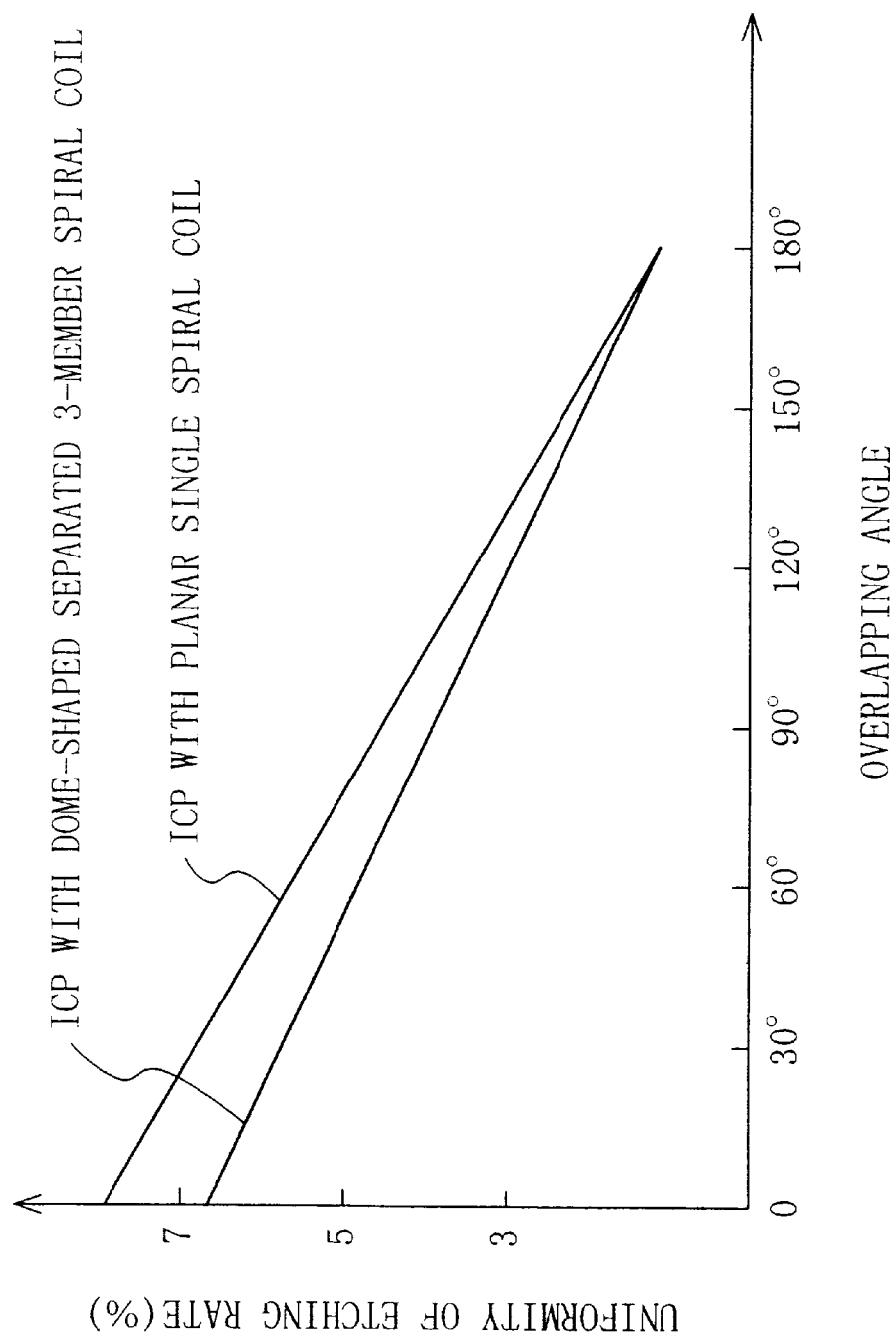
FIG. 6 shows the relationship between the uniformity of an etching rate and an overlapping angle in a method for plasma etching according to the first and second embodiments.

Referring to FIG. 6, a description will be given to the dependence of the uniformity of the etching rate on the overlapping angle between the higher-voltage region and the exhaust-side region in the method for plasma etching according to the second embodiment.

FIG. 6 shows the relationship between the uniformity of the etching rate and the overlapping angle in the method for plasma etching according to the first embodiment (ICP with the planar single spiral coil) and in the second method for plasma etching according to the second embodiment (ICP with a dome-shaped 3-member spiral coil). Conditions for the plasma etching process are as shown in Table 4. In Table 4, ICP denotes high-frequency power applied to the single spiral coil 4 or to the first to third spiral coils 4A to 4C and RF denotes high-frequency power applied to the sample stage 2.

TABLE 4

| | |
|---|---|
| $SO_2/O_2$ | 30/30 (sccm) |
| ICP/RF | 350/50 (W) |
| PRESSURE | 8 (mTorr) |
| TEMPERATURE OF SAMPLE STAGE | 10 (° C.) |

As shown in FIG. 6, the uniformity of the etching rate gradually improves as the overlapping angle approaches 180°.

The reason for the gradual improvement in the uniformity of the etching rate with the overlapping angle approaching 180° is that since the higher-voltage region (or lower-voltage region) of the single spiral coil 4 and the higher-voltage regions (or lower-voltage regions) of the first to third spiral coils 4A to 4C coincide with the exhaust-side region of the sample stage 2 (or with the counter-exhaust-side region), as described above, reactive radicals are evenly distributed over the plasma generation region in the chamber 1, resulting in a uniform etching rate for the target film on the semiconductor substrate 3 held by the sample stage 2.

EMBODIMENT 3

An apparatus and method for plasma etching according to a third embodiment of the present invention will be described with reference to FIGS. 1(a) and 1(b), FIG. 7, and FIG. 18(b).

Figure 18A:
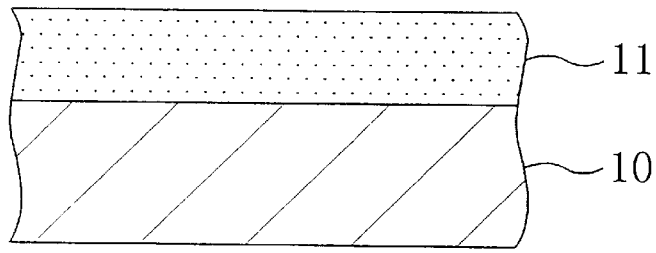
FIGS. 18(a) to 18(c) are cross-sectional views for illustrating a target film to be etched by a method for plasma etching according to the present invention and a conventional method for plasma etching.
Figure 18B:
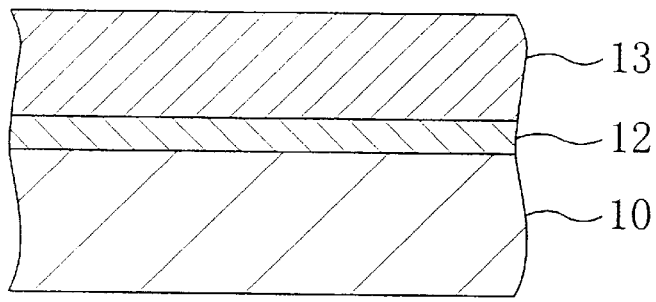

In the third embodiment in which dry etching is performed with respect to a polysilicon film 13 deposited on a silicon oxide film 12 overlying a semiconductor substrate 10 by using the apparatus for plasma etching according to the first embodiment as shown in FIG. 18(b), considerations will be given to the dependence of the uniformity of the etching rate on the overlapping angle between the higher-voltage region and the exhaust-side region. Process conditions for dry etching are as shown in Table 5. In Table 5, ICP denotes high-frequency power (hereinafter referred to as ICP power) applied to the single spiral coil 4, RF denotes high-frequency power (hereinafter referred to as RF power) applied to a sample stage 2, and x denotes the magnitude of ICP power.

TABLE 5

| | |
|---|---|
| HBr/Cl$_2$ | 100/100 (sccm) |
| ICP/RF | x/100 (W) |
| PRESSURE | 10 (mTorr) |
| TEMPERATURE OF SAMPLE STAGE | 50 (° C.) |

Figure 7:
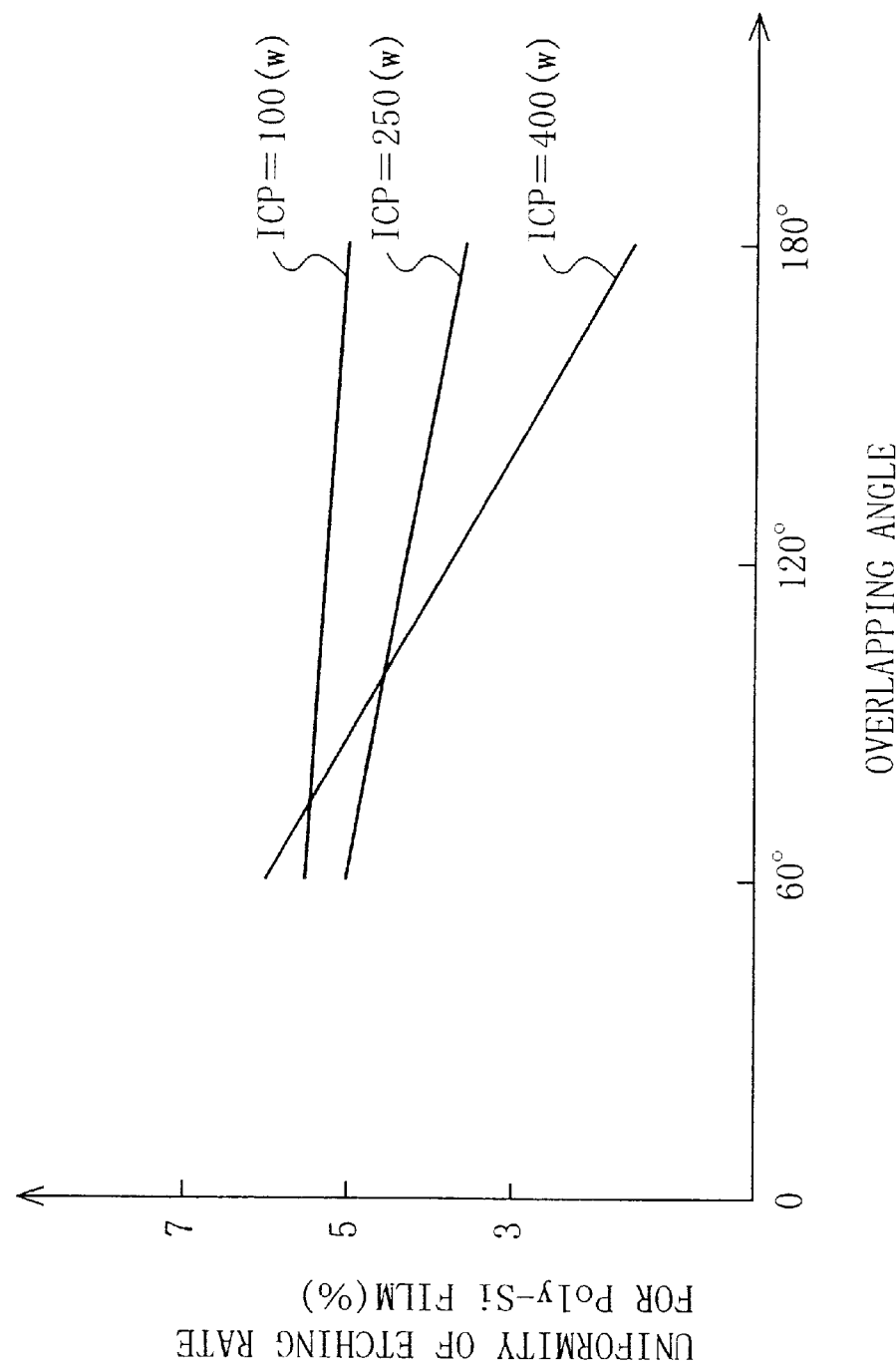
FIG. 7 shows the relationship between the uniformity of an etching rate and an overlapping angle in a method for plasma etching according to a third embodiment of the present invention.

FIG. 7 shows the dependence of the uniformity of the etching rate on the overlapping angle between the higher-voltage region and the exhaust-side region in the case of varying the ICP power x to 100, 250, and 400 W with the RF power held at 100 W. As will be understood from FIG. 7, the uniformity of the etching rate gradually decreases as the overlapping angle between the higher-voltage region and the exhaust-side region approaches 180°, while the dependence of the uniformity of the etching rate on the overlapping angle increases as the ICP power is larger, i.e., as the ratio of the ICP power to the RF power is larger. This is because the amount of plasma present in the plasma generation region increases as the ratio of the ICP power to the RF power increases so that the distribution of radicals in the plasma has greater influence on the uniformity of the etching rate.

EMBODIMENT 4

An apparatus and method for plasma etching according to a fourth embodiment of the present invention will be described with reference to FIGS. 1(a) and 1(b), FIG. 8, and FIG. 18(c).

Figure 18C:
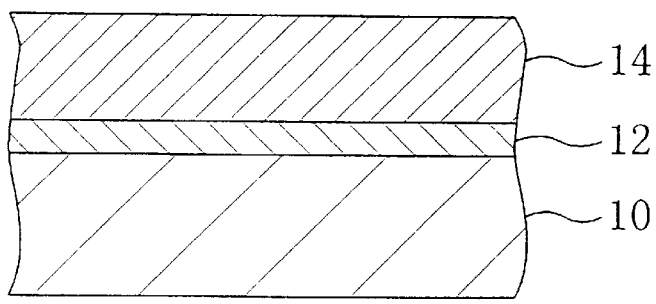

In the fourth embodiment in which dry etching is performed with respect to a tungsten silicon film 14 deposited on a silicon oxide film 12 overlying a semiconductor substrate 10 by using the apparatus for plasma etching according to the first embodiment as shown in FIG. 18(c), considerations will be given to the dependence of the uniformity of the etching rate on the overlapping angle between the higher-voltage region and the exhaust-side region. Process conditions for dry etching are as shown in Table 6. In Table 6, the denotations of ICP and RF are the same as in Table 5 and y denotes pressure in the chamber 1.

TABLE 6

| | |
|---|---|
| Cl$_2$/O$_2$ | 100/5 (sccm) |
| ICP/RF | 300/100 (W) |
| PRESSURE | y (mTorr) |
| TEMPERATURE OF SAMPLE STAGE | 50 (° C.) |

Figure 8:
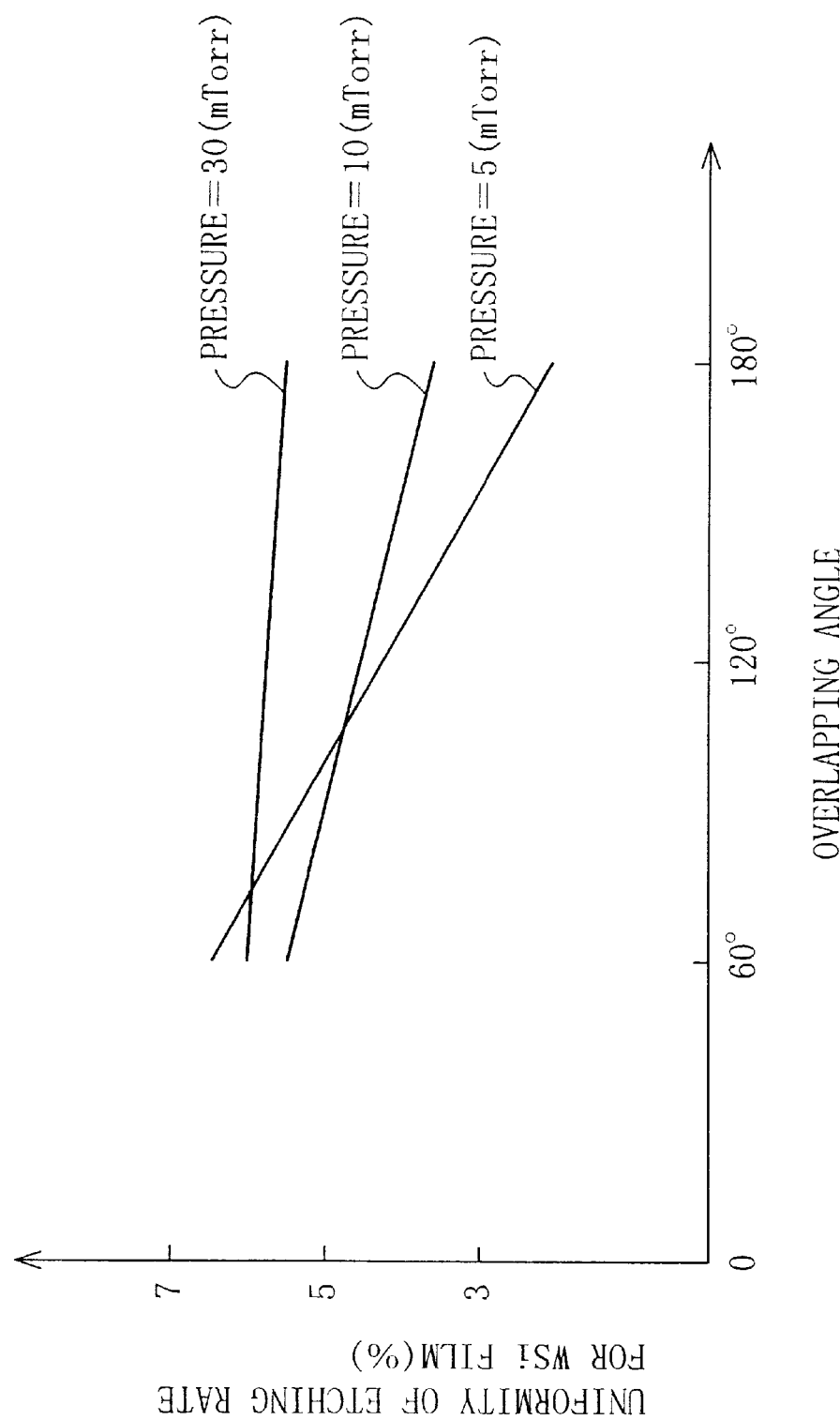
FIG. 8 shows the relationship between the uniformity of an etching rate and an overlapping angle in a method for plasma etching according to a fourth embodiment of the present invention.

FIG. 8 shows the dependence of the uniformity of the etching rate on the overlapping angle between the higher-voltage region and the exhaust region in the case of varying the pressure at the center portion in the chamber 1 (in the vicinity of the boundary between the exhaust-side region and the counter-exhaust-side region) to 5, 10, 30 mTorr. As will be understood from FIG. 8, the uniformity of the etching rate gradually decreases as the overlapping angle between the higher-voltage region and the exhaust-side region approaches 180°, while the dependence of the uniformity of the etching rate on the overlapping angle increases as the pressure in the chamber 1 is lower. This is because the mean free paths of radicals in the plasma are longer as the pressure inside the chamber 1 is lower, i.e., as the amount of the plasma present in the plasma generation region in the chamber 1 is smaller so that the distribution of radicals in the plasma has greater influence on the uniformity of the etching rate.

EMBODIMENT 5

Figure 9A:
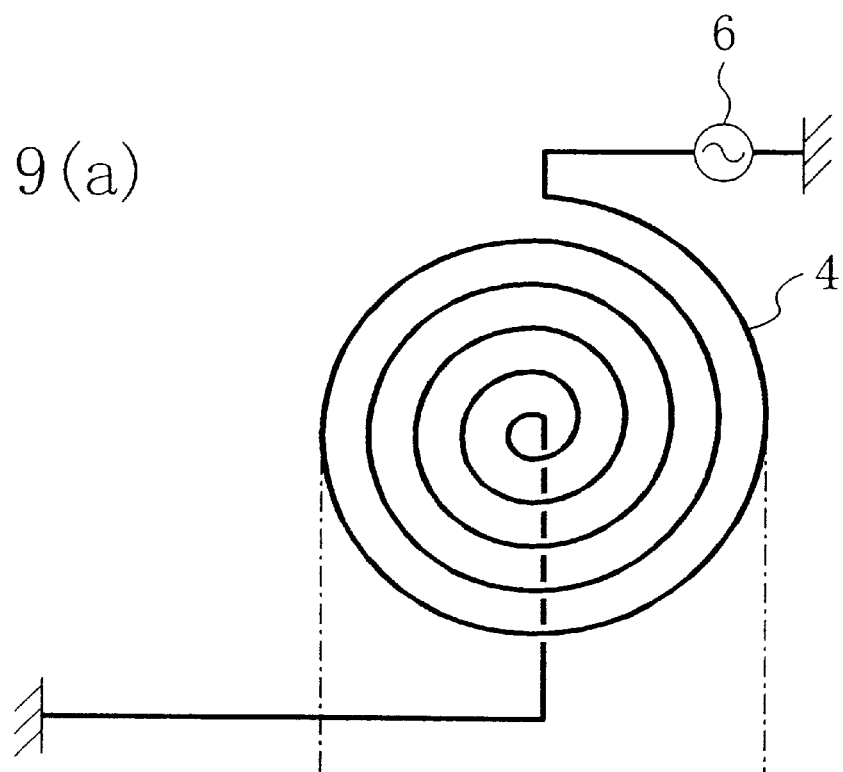
Figure 9B:
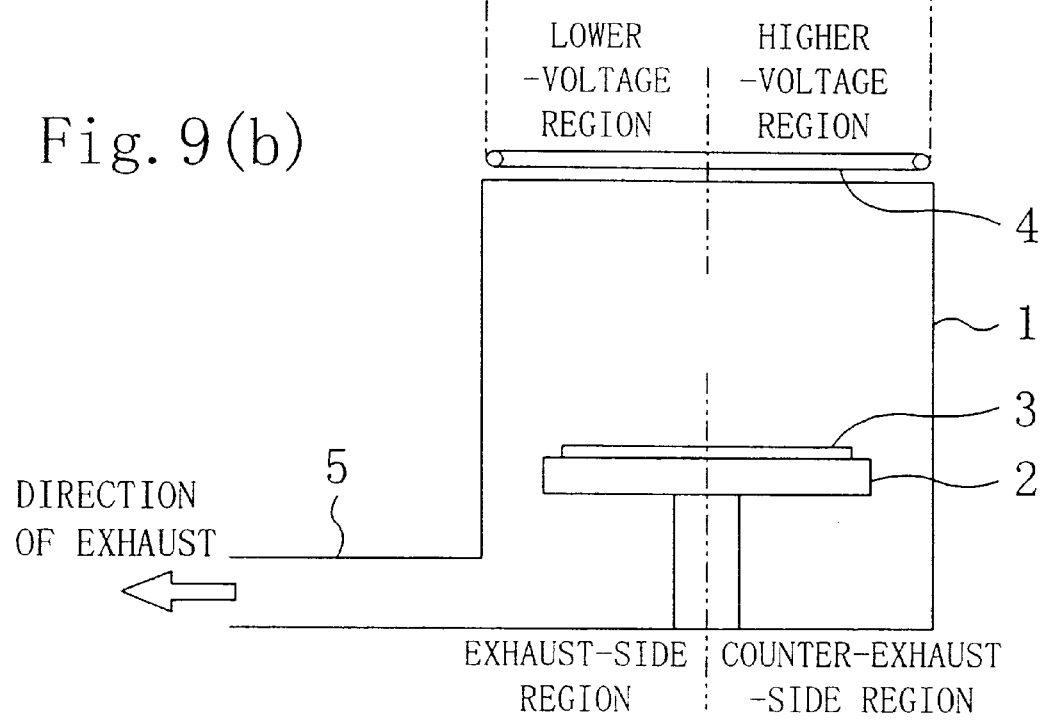

An apparatus and method for plasma etching according to a fifth embodiment of the present invention will be described with reference to FIGS. 9(a) and 9(b). As for the same components as used in the first embodiment, the description thereof will be omitted by providing the same reference numerals.

The fifth embodiment is characterized in that a lower-voltage region which is the region of the single spiral coil 4 relatively low in voltage and an exhaust-side region which is the region of the sample stage 2 closer to the gas outlet port 5 are positioned on the same side (left side of FIG. 9) relative to the center axis of the chamber 1, while a higher-voltage region which is the region of the single spiral coil 4 relatively high in voltage and a counter-exhaust-side region which is the region of the sample stage 2 further away from the gas outlet port 5 are positioned on the same side (right side of FIG. 9) relative to the center axis of the chamber 1. As a result, the degree of the rotation angle θ (see FIGS. 1 to 13) formed between the line L2 and the line L1 which is rotating clockwise relative to the second line L2 is zero.

Accordingly, the quantity of reactive radicals is smaller in the area of the plasma generation region in the chamber 1 corresponding to the lower-voltage region of the single spiral coil 4 and to the exhaust-side region of the sample stage 2, while the quantity of reactive radicals is larger in the area of the plasma generation region corresponding to the higher-voltage region of the single spiral coil 4 and to the counter-exhaust-side region of the sample stage 2. Consequently, reactive radicals are unevenly distributed over the plasma generation region in the chamber 1 and therefore the etching rate for a target film on the semiconductor substrate 3 held by the sample stage 2 is not uniform. The etching rate is lower in the area of the plasma generation region in the chamber 1 corresponding to the lower-voltage region of the single spiral coil 4 and to the exhaust-side region of the chamber 1, while the etching rate is higher in the area of the plasma generation region in the chamber 1 corresponding to the higher-voltage region of the single spiral coil 4 and to the counter-exhaust-side region of the sample stage 2. Although the etching rate for the target film on the semiconductor substrate 3 held by the sample stage 2 is not uniform, variations in etching rate from apparatus to apparatus for plasma etching are reduced.

When plasma etching was performed with respect to the ARC 11 shown in FIG. 18(a) according to the fifth embodiment under the conditions shown in Table 1, the uniformity of the etching rate was ±7.8% but the etching rate did not vary with different apparatus for plasma etching.

In each of the above embodiments, the type of the target film does not present a particular problem. It will be appreciated that the same effects can be achieved with any of the ARC, a resist film, a silicon-based film, a nitride-based film, a metal alloy film, a ferroelectric film, and the like.

What is claimed is:

1. A method for plasma etching, said method comprising:

a plasma generating step of changing etching gas introduced into a chamber into a plasma with a high-frequency induction field generated by a spiral coil disposed in opposing relation with a sample stage in said chamber;

an etching step of guiding the plasma toward a target film on a substrate held by said sample stage to etch said target film; and a gas exhaust step of exhausting gas from said chamber through a gas outlet port provided in a side portion of said chamber, said etching step including the step of guiding the plasma toward said target film to etch said target film, with a higher-voltage region of said spiral coil and an exhaust-side region of said sample stage being positioned on the same side relative to a center axis of said chamber, said higher-voltage region of said spiral coil and said exhaust-side region of said sample stage overlapping each other such that an overlapping angle defined by the position of a center line of said spiral coil relative to the position of a center line of the sample stage is in a range of 135–180°.

2. A method for plasma etching according to claim 1, wherein high-frequency power applied to said spiral coil is higher than high-frequency power applied to said sample stage.

3. A method for plasma etching according to claim 1, wherein said target film is an organic film.

4. A method for plasma etching according to claim 1 wherein said target film is an organic bottom anti-reflective coating or a resist film.

5. A method for plasma etching according to claim 1 wherein an overlapping angle of 180° defines the maximum possible overlap between the higher-voltage region of said spiral coil and said exhaust-side region of said sample stage.

6. A method for plasma etching according to claim 1 wherein an overlapping angle of 0° defines no overlap between the higher-voltage region of said spiral coil and said exhaust-side region of said sample stage.

7. A method for plasma etching, said method comprising:

a plasma generating step of changing etching gas introduced into a chamber into a plasma with a high-frequency induction field generated by a spiral coil disposed in opposing relation with a sample stage in said chamber;

an etching step of guiding the plasma toward a target film on a substrate held by said sample stage to etch said target film; and a gas exhaust step of exhausting gas from said chamber through a gas outlet port provided in a side portion of said chamber, said etching step including the step of guiding the plasma toward said target film to etch said target film, with a higher-voltage region of said spiral coil and an exhaust-side region of said sample stage being positioned on the same side relative to a center axis of said chamber, said higher-voltage region of said spiral coil and said exhaust-side region of said sample stage overlapping each other such at least 75% of said higher-voltage region of said spiral coil overlaps said exhaust-side region of said sample stage.

* * * * *